United States Patent
Ramesh

(10) Patent No.: US 11,080,017 B2
(45) Date of Patent: Aug. 3, 2021

(54) HOST-BASED BIT STRING CONVERSION

(71) Applicant: Micron Technology, Inc., Boise, ID (US)

(72) Inventor: Vijay S. Ramesh, Boise, ID (US)

(73) Assignee: Micron Technology, Inc., Boise, ID (US)

(*) Notice: Subject to any disclaimer, the term of this patent is extended or adjusted under 35 U.S.C. 154(b) by 149 days.

(21) Appl. No.: 16/281,587

(22) Filed: Feb. 21, 2019

(65) Prior Publication Data

US 2020/0274547 A1    Aug. 27, 2020

(51) Int. Cl.
G06F 7/483    (2006.01)
H03M 7/24    (2006.01)

(52) U.S. Cl.
CPC .............. *G06F 7/483* (2013.01); *H03M 7/24* (2013.01)

(58) Field of Classification Search
CPC ............ G06F 7/483; G06F 7/38; H03M 7/24
See application file for complete search history.

(56) References Cited

U.S. PATENT DOCUMENTS

| | | | |
|---|---|---|---|
| 5,572,207 A | 11/1996 | Harding et al. | |
| 9,430,735 B1* | 8/2016 | Vali | G11C 16/08 |
| 9,608,662 B2 | 3/2017 | Lutz et al. | |
| 9,836,218 B2* | 12/2017 | Willcock | G06F 3/065 |
| 9,965,208 B1* | 5/2018 | Roohparvar | G06F 3/0688 |
| 2011/0302393 A1 | 12/2011 | Matsumoto et al. | |
| 2012/0030242 A1 | 2/2012 | Nakamura et al. | |
| 2013/0262809 A1* | 10/2013 | Wegener | H03M 7/24 711/165 |
| 2016/0379686 A1* | 12/2016 | Burger | G06F 15/7821 711/170 |
| 2017/0192686 A1* | 7/2017 | Niu | G06F 12/0246 |
| 2017/0329577 A1* | 11/2017 | Tiwari | G11C 11/4076 |
| 2018/0033479 A1* | 2/2018 | Lea | G11C 8/12 |
| 2018/0067720 A1* | 3/2018 | Bekas | G06F 7/48 |
| 2018/0121789 A1* | 5/2018 | Ouyang | G06N 3/063 |
| 2018/0150282 A1 | 5/2018 | Zhang et al. | |

(Continued)

OTHER PUBLICATIONS

M. K. Jaiswal and H. K. -. So, "Universal number posit arithmetic generator on FPGA," 2018 Design, Automation & Test in Europe Conference & Exhibition (DATE), Dresden, 2018, pp. 1159-1162, doi: 10.23919/DATE.2018.8342187. (Year: 2018).*

(Continued)

*Primary Examiner* — Aimee Li
*Assistant Examiner* — Carlo Waje
(74) *Attorney, Agent, or Firm* — Brooks, Cameron & Huebsch, PLLC

(57) ABSTRACT

Systems, apparatuses, and methods related to host-based bit string conversion are described. A conversion component may be deployed on a host computing system and configured to perform operations on bit strings to selectively convert the bit string between various numeric formats, such as floating-point and/or universal number (e.g., posit) formats. The conversion component may comprise a processing device that may be coupled to one or more memory resources. The memory resource of the conversion component may be configured to receive a bit string having a first format. The processing device of the conversion component coupled to the memory resource may be configured to format or convert the bit string to a second format.

18 Claims, 6 Drawing Sheets

(56) References Cited

U.S. PATENT DOCUMENTS

| | | |
|---|---|---|
| 2018/0276547 A1 | 9/2018 | Carlough et al. |
| 2018/0314671 A1* | 11/2018 | Zhang ............... G06F 15/8046 |
| 2018/0373498 A1* | 12/2018 | Gschwind ........... G06F 9/30094 |
| 2020/0167632 A1* | 5/2020 | Kim ..................... G06F 5/012 |

OTHER PUBLICATIONS

Gao et al. "TETRIS: Scalable and Efficient Neural Network Acceleration with 3D Memory", ASPLOS '17: Proceedings of the Twenty-Second International Conference on Architectural Support for Programming Languages and Operating Systems, Apr. 2017 pp. 751-764, https://doi.org/10.1145/3037697.3037702 (Year: 2017).*

Carmichael et al. "Deep Positron: A Deep Neural Network Using the Posit Number System". Retrieved on [Sep. 2, 2020], Retrieved from the Internet https://arxiv.org/pdf/1812.01762.pdf2019 (Year: 2019).*

R. Chaurasiya et al., "Parameterized Posit Arithmetic Hardware Generator," 2018 IEEE 36th International Conference on Computer Design (ICCD), Orlando, FL, USA, 2018, pp. 334-341, doi: 10.1109/ICCD.2018.00057. (Year: 2018).*

Gustafson, "Posit Arithmetic". Retrieved on [Sep. 2, 2020], Retrieved from the Internet <https://posithub.org/docs/Posits4.pdf> (Year: 2017).*

Wan et al. "Study of Posit Numeric in Speech Recognition Neural Inference". Retrieved on [Sep. 2, 2020], Retrieved from the Internet <https://scholar.harvard.edu/files/zishenwan/files/cs247r_project.pdf> (Year: 2018).*

International Search Report and Written Opinion from related International Application Serial No. PCT/US2020/016215, dated Jun. 4, 2020, 11 pages.

Gustafson, et al., "Beating Floating Point at its Own Game: Posit Arithmetic", Research Paper, 16 pages.

Cococcioni, et al., Exploiting Posit Arithmetic for Deep Neural Networks in Autonomous Driving Applications:, Conference Paper, May 2018, 7 pages.

\* cited by examiner

HOST-BASED BIT STRING CONVERSION

TECHNICAL FIELD

The present disclosure relates generally to semiconductor memory and methods, and more particularly, to apparatuses, systems, and methods for host-based bit string conversion.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices may be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
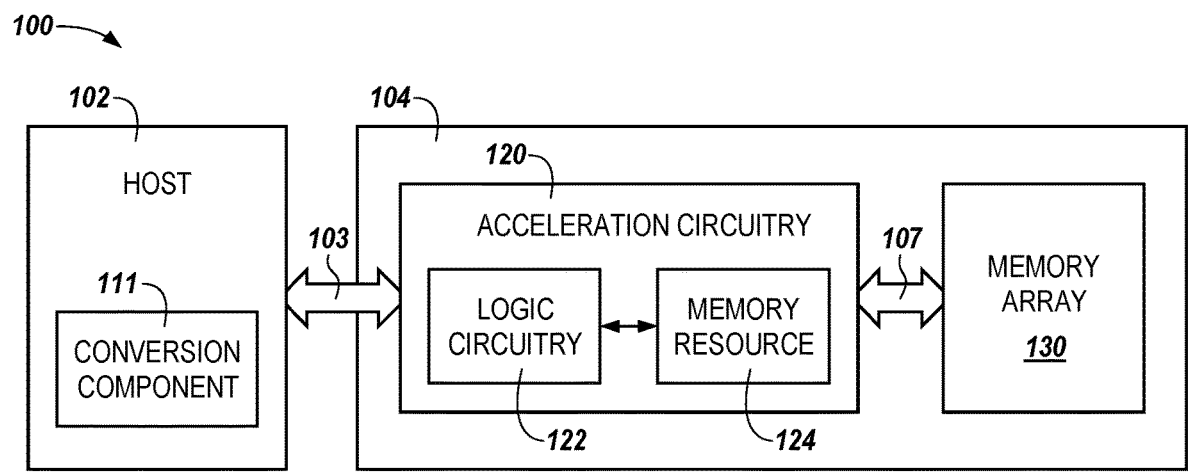
FIG. 1 is a functional block diagram in the form of a computing system including an apparatus including a host and a memory device in accordance with a number of embodiments of the present disclosure.

Systems, apparatuses, and methods related to host-based bit string conversion are described. A conversion component may be deployed on a host computing system and configured to perform operations on bit strings to selectively convert the bit string between various numeric formats, such as floating-point and/or universal number (e.g., posit) formats. The conversion component may comprise a processing device that may be coupled to one or more memory resources. The memory resource of the conversion component may be configured to receive a bit string having a first format. The processing device of the conversion component coupled to the memory resource may be configured to format or convert the bit string according to a second format.

The memory resource may be resident on a host computing system and may be coupled to a processing device that is resident on the host computing system. The memory resource may be configured to receive data comprising a bit string having a first format that supports arithmetic operations to a first level of precision. The processing device may be configured to receive the data from the memory resource and convert the bit string to a second format that supports arithmetic operations to a second level of precision that is different from the first level of precision. In some embodiments, the first format can be an IEEE 754 format, such as a floating-point format, while the second format can be a universal number (unum) format, such as a Type III unum or posit format.

The conversion component can further perform arithmetic and/or logical operations on the bit strings after the bit strings have been converted to a particular format or transfer the converted bit strings to external circuitry that can perform arithmetic and/or logical operations on the bit strings after the bit strings have been converted to a particular format.

Computing systems may perform a wide range of operations that can include various calculations, which can require differing degrees of accuracy. However, computing systems have a finite amount of memory in which to store operands on which calculations are to be performed. In order to facilitate performance of operation on operands stored by a computing system within the constraints imposed by finite memory resources, in some approaches operands are stored in particular formats. One such format is referred to as the "floating-point" format, or "float," for simplicity (e.g., the IEEE 754 floating-point format).

Under the floating-point standard, bit strings (e.g., strings of bits that can represent a number), such as binary number strings, are represented in terms of three sets of integers or sets of bits—a set of bits referred to as a "base," a set of bits referred to as an "exponent," and a set of bits referred to as a "mantissa" (or significand). The sets of integers or bits that define the format in which a binary number string is stored may be referred to herein as an "numeric format," or "format," for simplicity. For example, the three sets of integers of bits described above (e.g., the base, exponent, and mantissa) that define a floating-point bit string may be referred to as a format (e.g., a first format). As described in more detail below, a posit bit string may include four sets of integers or sets of bits (e.g., a sign, a regime, an exponent, and a mantissa), which may also be referred to as a "numeric format," or "format," (e.g., a second format). In addition, under the floating-point standard, two infinities (e.g., +∞ and −∞) and/or two kinds of "NaN" (not-a-number): a quiet NaN and a signaling NaN, may be included in a bit string.

The floating-point standard has been used in computing systems for a number of years and defines arithmetic formats, interchange formats, rounding rules, operations, and exception handling for computation carried out by many computing systems. Arithmetic formats can include binary and/or decimal floating-point data, which can include finite numbers, infinities, and/or special NaN values. Interchange formats can include encodings (e.g., bit strings) that may be used to exchange floating-point data. Rounding rules can include a set of properties that may be satisfied when rounding numbers during arithmetic operations and/or conversion operations. Floating-point operations can include arithmetic operations and/or other computational operations such as trigonometric functions. Exception handling can include indications of exceptional conditions, such as division by zero, overflows, etc.

An alternative format to floating-point is referred to as a "universal number" (unum) format. There are several forms of unum formats—Type I unums, Type II unums, and Type III unums, which can be referred to as "posits" and/or "valids." Type I unums are a superset of the IEEE 754 standard floating-point format that use a "ubit" at the end of the fraction to indicate whether a real number is an exact float, or if it lies in the interval between adjacent floats. The sign, exponent, and fraction bits in a Type I unum take their definition from the IEEE 754 floating-point format, however, the length of the exponent and fraction fields of Type I unums can vary dramatically, from a single bit to a maximum user-definable length. By taking the sign, exponent, and fraction bits from the IEEE 754 standard floating-point format, Type I unums can behave similar to floating-point numbers, however, the variable bit length exhibited in the exponent and fraction bits of the Type I unum can require additional management in comparison to floats.

Type II unums are generally incompatible with floats, which permits a clean, mathematical design based on projected real numbers. A Type II unum can include n bits and can be described in terms of a "u-lattice" in which quadrants of a circular projection are populated with an ordered set of $2^{n-3}-1$ real numbers. The values of the Type II unum can be reflected about an axis bisecting the circular projection such that positive values lie in an upper right quadrant of the circular projection, while their negative counterparts lie in an upper left quadrant of the circular projection. The lower half of the circular projection representing a Type II unum can include reciprocals of the values that lie in the upper half of the circular projection. Type II unums generally rely on a look-up table for most operations. For example, the size of the look-up table can limit the efficacy of Type II unums in some circumstances. However, Type II unums can provide improved computational functionality in comparison with floats under some conditions.

The Type III unum format is referred to herein as a "posit format" or, for simplicity, a "posit." In contrast to floating-point bit strings, posits can, under certain conditions, allow for a broader dynamic range and a higher accuracy (e.g., precision) than floating-point numbers with the same bit width. This can allow for operations performed by a computing system to be performed at a higher rate (e.g., faster) when using posits than with floating-point numbers, which, in turn, can improve the performance of the computing system by, for example, reducing a number of clock cycles used in performing operations, thereby reducing processing time and/or power consumed in performing such operations. In addition, the use of posits in computing systems can allow for higher accuracy and/or precision than floating-point numbers, which can further improve the functioning of a computing system in comparison to some approaches (e.g., approaches which rely upon floating-point format bit strings).

Embodiments herein are directed to hardware circuitry (e.g., a conversion component and/or acceleration circuitry) configured to perform various operations on bit strings to improve the overall functioning of a computing device. For example, embodiments herein are directed to hardware circuitry that is configured to perform conversion operations to convert a format of a bit string from a first format (e.g., a floating-point format) to a second format (e.g., a unum format, a posit format, etc.). Once the bit string(s) have been converted to the second format, the circuitry can be operated to perform operations (e.g., arithmetic operations, logical operations, bit-wise operation, vector operations, etc.) on the converted bit strings or cause the converted bit strings to be transferred to other circuitry to perform such operations.

In some embodiments, the hardware circuitry can be further operated to convert the results of the operations back to the first format (e.g., to a floating-point format), which can, in turn, be transferred to different circuitry (e.g., a host, a memory device, etc.) of the computing system. By performing the operations in such a manner, the hardware circuitry can facilitate improved performance of the computing system by allowing for improved accuracy and/or precision in the performed operations, improved speed in performing the operations, and/or a reduced required storage space for bit strings prior to, during, or subsequent to, performance of arithmetic and/or logical operations.

In various embodiments described herein, the hardware circuitry (e.g., a host conversion component, or simply a "conversion component") that can be operated to perform operations to convert bit strings from one format to another format, and vice versa, and/or cause arithmetic operations and/or logical operations to be performed on the converted bit strings can be resident on a host computing system. As used herein, the term "resident on" refers to something that is physically located on a particular component. For example, the conversion component being "resident on" the host computing system refers to a condition in which the hardware that comprises the conversion component is physically located on the host computing system. The term "resident on" may be used interchangeably with other terms such as "deployed on" or "located on," herein.

By performing operations to convert bit strings from one format to another format, and vice versa, and/or perform arithmetic operations using hardware circuitry, such as a conversion component that is resident on the host computing system, improved performance of the above-described operations can be realized in comparison to approaches in which such operations are performed using circuitry that is not resident on the host computing system. For example, in approaches in which operations to convert bit strings from one format to another format, and vice versa, are performed using circuitry resident on a memory device, a greater number of clock cycles and/or a greater amount of time may be required to perform such operations due to the tendency for processing capability on a memory device to be diminished in comparison to the processing capacity of a host computing system.

Stated alternatively, because a host computing system can include superior processing resources in comparison to the processing resources generally provided to a memory device, by performing operations to convert bit strings from one format to another format, and vice versa, using a conversion component resident on the host computing system, such operations may be performed using less clock cycles, and therefore in a shorter period of time, than approaches in which such operations are performed using circuitry resident on the memory device. Further, performing operations to convert bit strings from one format to another format, and vice versa, using a conversion component resident on the host computing system can free up limited resources that may be consumed by other circuitry (e.g., circuitry resident on a memory device coupled to the host computing system) in some approaches to perform arithmetic and/or logical operations on the bit strings without being encumbered by performance of conversion operations, which can lead to reduced resource consumption by circuitry resident on the memory device.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "N," "M," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a," "an," and "the" can include both singular and plural referents, unless the context clearly dictates otherwise. In addition, "a number of," "at least one," and "one or more" (e.g., a number of memory banks) can refer to one or more memory banks, whereas a "plurality of" is intended to refer to more than one of such things.

Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "bit strings," "data," and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 120 may reference element "20" in FIG. 1, and a similar element may be referenced as 220 in FIG. 2. A group or plurality of similar elements or components may generally be referred to herein with a single element number. For example, a plurality of reference elements 433-1, 433-2, . . . , 433-N may be referred to generally as 433. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a functional block diagram in the form of a computing system 100 including an apparatus including a host 102 and a memory device 104 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In addition, each of the components (e.g., the host 102, the conversion component 111, the acceleration circuitry 120, the logic circuitry 122, the memory resource 124, and/or the memory array 130) can be separately referred to herein as an "apparatus."

The memory device 104 can include one or more memory modules (e.g., single in-line memory modules, dual in-line memory modules, etc.). The memory device 104 can include volatile memory and/or non-volatile memory. In a number of embodiments, the memory device 104 can include a multi-chip device. A multi-chip device can include a number of different memory types and/or memory modules. For example, the memory device 104 can include non-volatile or volatile memory on any type of a module.

The memory device 104 can provide main memory for the computing system 100 or can be used as additional memory or storage throughout the computing system 100. The memory device 104 can include one or more memory arrays 130 (e.g., arrays of memory cells), which can include volatile and/or non-volatile memory cells. The memory array 130 can be a flash array with a NAND architecture, for example. Embodiments are not limited to a particular type of memory device, however, and the memory device 104 can include RAM, ROM, DRAM, SDRAM, PCRAM, RRAM, and/or flash memory, among others.

In embodiments in which the memory device 104 includes non-volatile memory, the memory device 104 can include flash memory devices such as NAND or NOR flash memory devices. Embodiments are not so limited, however, and the memory device 104 can include other non-volatile memory devices such as non-volatile random-access memory devices (e.g., NVRAM, ReRAM, FeRAM, MRAM, PCM), "emerging" memory devices such as 3-D Crosspoint (3D XP) memory devices, etc., or combinations thereof. A 3D XP array of non-volatile memory can perform bit storage based on a change of bulk resistance, in conjunction with a stackable cross-gridded data access array. Additionally, in contrast to many flash-based memories, 3D XP non-volatile memory can perform a write in-place operation, where a non-volatile memory cell can be programmed without the non-volatile memory cell being previously erased.

As illustrated in FIG. 1, a host 102 can be coupled to the memory device 104. In a number of embodiments, the host 102 can be coupled to the memory device 104 via one or more channels 103 (e.g., buses, interfaces, communication paths, etc.). In addition, the acceleration circuitry 120 of the memory device 104 can be coupled to the memory array 130 via a channel 107. The channel(s) 103 can be used to transfer data between the memory device 104 and a host 102 and can be in the form of a standardized interface. For example, when the memory device 104 is used for data storage in a computing system 100, the channel(s) 103 can be a serial advanced technology attachment (SATA), peripheral component interconnect express (PCIe), or a universal serial bus (USB), a double data rate (DDR) interface, among other connectors and interfaces. In general, however, channel(s) 103 can provide an interface for passing control, address, data, and other signals between the memory device 104 and a host 102 having compatible receptors for the channel(s) 103.

The host 102 can be a host system such as a personal laptop computer, a desktop computer, a digital camera, a mobile telephone, an internet-of-things (IoT) enabled device, or a memory card reader, graphics processing unit (e.g., a video card), among various other types of hosts. The host 102 can include a system motherboard and/or backplane and can include a number of memory access devices, e.g., a number of processing devices (e.g., one or more processors, microprocessors, or some other type of controlling circuitry). One of ordinary skill in the art will appreciate that "a processor" can intend one or more processors, such as a parallel processing system, a number of coprocessors, etc.

The computing system 100 can include separate integrated circuits or both the host 102, the memory device 104, and the memory array 130 can be on the same integrated circuit. The computing system 100 can be, for instance, a server system and/or a high-performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

In some embodiments, the host 102 can be responsible for executing an operating system for a computing system 100 that includes the memory device 104. Accordingly, in some embodiments, the host 102 can be responsible for controlling operation of the memory device 104. For example, the host 102 can execute instructions (e.g., in the form of an operating system) that manage the hardware of the computing system 100 such as scheduling tasks, executing applications, controlling peripherals, etc.

The host can include a conversion component 111. The conversion component 111 can be provided in the form of an integrated circuit, such as an application-specific integrated circuit (ASIC), field programmable gate array (FPGA), system-on-a-chip, or other combination of hardware and/or circuitry that is configured to perform operations described in more detail, herein. In some embodiments, the conversion component 111 can include a processing device, such as the processing device 213 illustrated in FIG. 2A and/or a memory resource, such as the conversion component memory resource 215 illustrated in FIG. 2A.

As described in more detail, herein, the conversion component 111 can be configured to perform various operations on bit strings received by, and/or stored by, the conversion component 111. For example, the conversion component 111 can be configured to perform operations to convert bit strings from one format to another format, and vice versa. In some embodiments, converting a bit string from one format (e.g., a first format) to another format (e.g., a second format) can include converting a bit string stored in a floating-point format to a bit string stored in a posit format, and vice versa. For example, the conversion component 111 can convert bit strings that have three sets of bits (e.g., portions) associated therewith (e.g., a mantissa portion, a base portion, and an exponent portion) into bit strings that have four sets of bits associated therewith (e.g., a mantissa portion, a sign portion, a regime portion, and an exponent portion), and vice versa.

In some embodiments, the conversion component 111 can be configured to transfer bit strings from the host 102 to the memory device 104 (e.g., to the acceleration circuitry 120 and/or the memory array 130). The bit strings transferred from the conversion component 111 to the memory device 104 can be bit strings that have been converted from one format (e.g., a floating-point format) to another format (e.g., a posit format). As described in more detail below, circuitry such as the acceleration circuitry 120 resident on the memory device 102 can perform arithmetic and/or logical operations on the bit strings received from the conversion component 111 and/or the host 102.

Figure 2A:
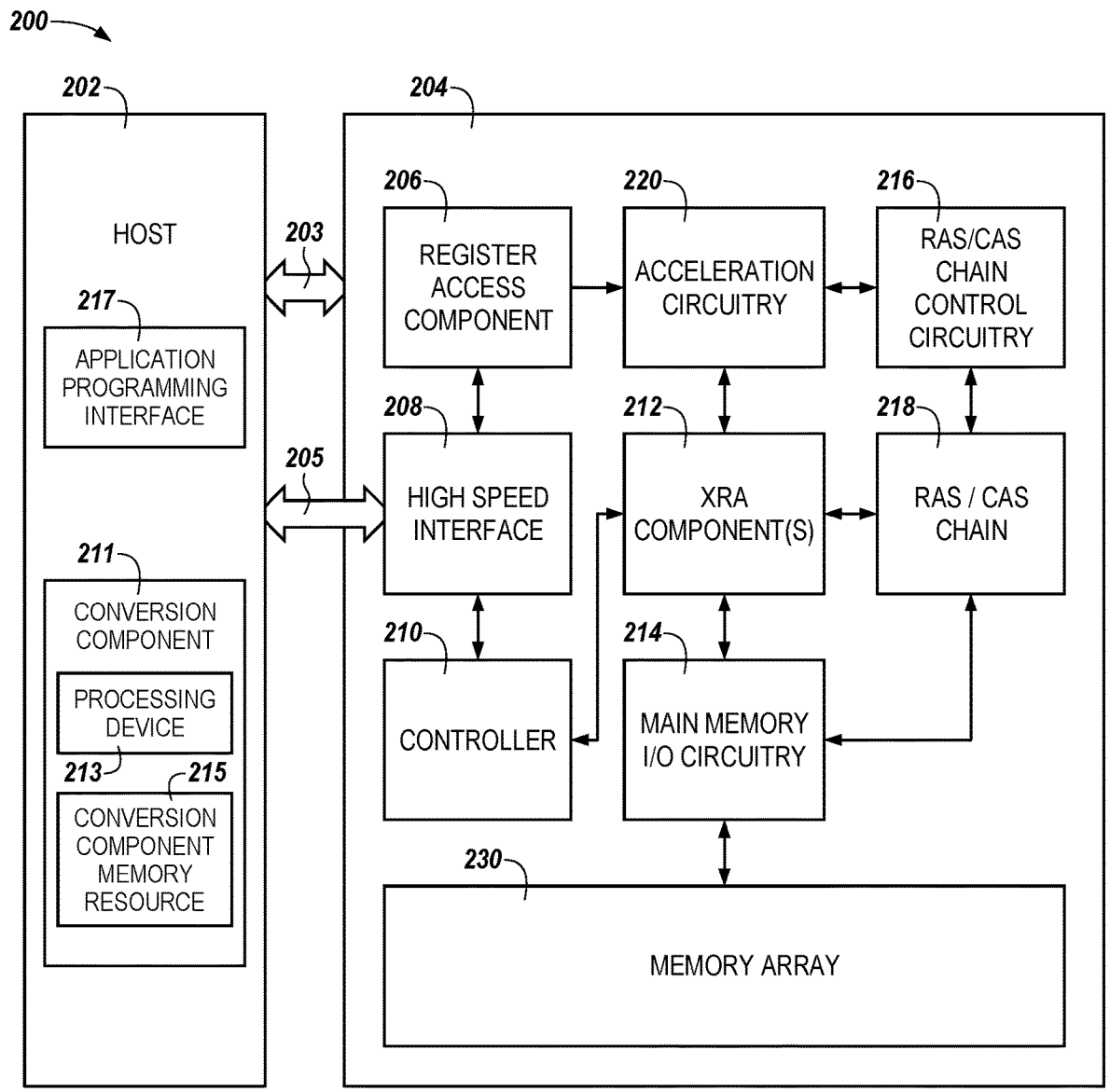
FIG. 2A is another functional block diagram in the form of a computing system including an apparatus including a host and a memory device in accordance with a number of embodiments of the present disclosure.
Figure 2B:
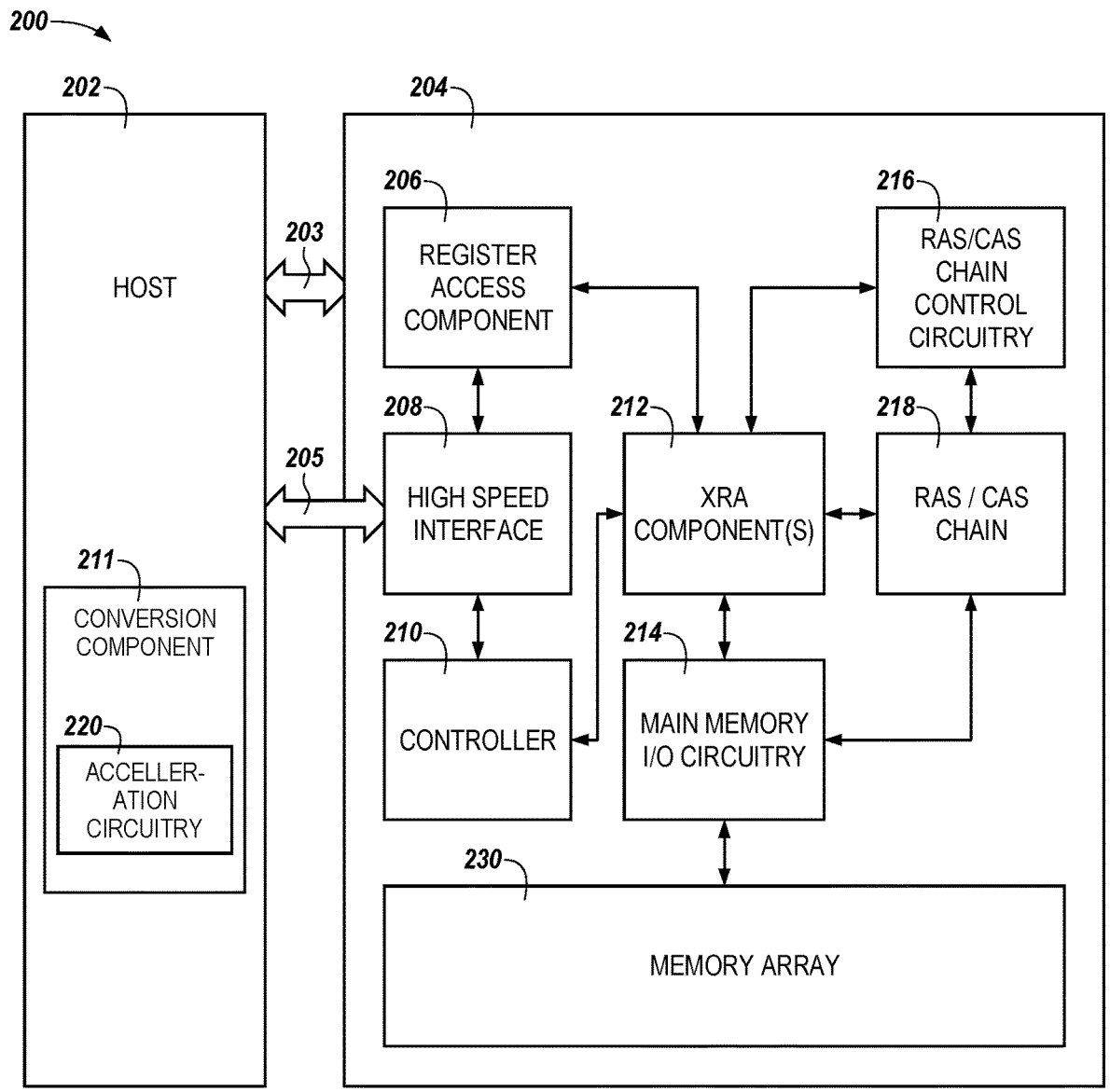
FIG. 2B is yet another functional block diagram in the form of a computing system including an apparatus including a host and a memory device in accordance with a number of embodiments of the present disclosure.

The memory device 104, which is shown in more detail in FIGS. 2A and 2B, herein, can include acceleration circuitry 120, which can include logic circuitry 122 and a memory resource 124. The logic circuitry 122 can be provided in the form of an integrated circuit, such as an application-specific integrated circuit (ASIC), field programmable gate array (FPGA), system-on-a-chip, or other combination of hardware and/or circuitry that is configured to perform arithmetic and/or logical operations on bit string received from the host 102 and/or the conversion component 111, as described in more detail, herein. In some embodiments, the logic circuitry 122 can include an arithmetic logic unit (ALU). The ALU can include circuitry (e.g., hardware, logic, one or more processing devices, etc.) to perform operations (e.g., arithmetic operations, logical operations, bitwise operations, etc.) such as the operations described above, on integer binary bit strings, such as bit strings in the posit format. Embodiments are not limited to an ALU, however, and in some embodiments, the logic circuitry 122 can include a state machine and/or an instruction set architecture (or combinations thereof) in addition to, or in lieu of the ALU, as described in more detail in connection with FIG. 5, herein.

For example, the logic circuitry 122 can be configured to receive one or more bit strings (e.g., a plurality of bits) in a posit format and/or cause performance of operations such as arithmetic and/or logical operations using the bit strings in the posit format. In contrast to bit strings in the floating-point format, which include three integers or sets of bits—a set of bits referred to as a "base," a set of bits referred to as an "exponent," and a set of bits referred to as a "mantissa" (or significand), the bit string(s) in the posit format include four sets of bits—at least one bit referred to as a "sign," a set of bits referred to as a "regime," a set of bits referred to as an "exponent," and a set of bits referred to as a "mantissa" (or significand). As used herein, a set of bits is intended to refer to a subset of bits included in a bit string. Examples of the sign, regime, exponent, and mantissa sets of bits are described in more detail in connection with FIGS. 3 and 4A-4B, herein.

In some embodiments, the logic circuitry 122 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings. As will be appreciated, the foregoing list of operations is not intended to be exhaustive, nor is the foregoing list of operations intended to be limiting, and the logic circuitry 122 may be configured to perform (or cause performance of) other arithmetic and/or logical operations.

After the acceleration circuitry 120 has performed an arithmetic and/or logical operation on the bit string(s), the acceleration circuitry 120 can cause a resultant (e.g., a resultant bit string representing a result of the arithmetic operation and/or the logical operation) bit string to be transferred to the host 102, the conversion component 111, and/or the memory array 130. In some embodiments, the acceleration circuitry 120 can transfer the resultant bit string(s) to the host 102, the conversion component 111, and/or the memory array 130, for example, in the post format.

In response to receiving the resultant bit string(s) in the posit format, the conversion component 111 can be configured to perform an operation to convert the resultant bit string(s) from the format in which they are received to another format. For example, in embodiments in which the resultant bit string(s) are received by the conversion component 111 in the posit format, the conversion component 111 can perform an operation to convert the resultant bit string(s) into a different format, such as a floating-point format. That is, in some embodiments, the conversion component 111 can convert bit strings that have four sets of bits (e.g., portions) associated therewith (e.g., a mantissa portion, a sign portion, a regime portion, and an exponent portion) to bit strings that have three sets of bits associated therewith (e.g., a mantissa portion, a base portion, and an exponent portion).

The acceleration circuitry 120 can further include a memory resource 124, which can be communicatively coupled to the logic circuitry 122. The memory resource 124 can include volatile memory resource, non-volatile memory resources, or a combination of volatile and non-volatile memory resources. In some embodiments, the memory resource 124 can be a random-access memory (RAM) such as static random-access memory (SRAM). Embodiments are not so limited, however, and the memory resource 124 can be a cache, one or more registers, NVRAM, ReRAM, FeRAM, MRAM, PCM), "emerging" memory devices such as 3-D Crosspoint (3D XP) memory devices, etc., or combinations thereof.

The acceleration circuitry 120 can be communicatively coupled to the memory array 130 via one or more channels 107. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by sense lines, which may be referred to herein as data lines or digit lines. Although a single array 130 is shown in FIG. 1, embodiments are not so limited. For instance, memory device 104 a number of memory arrays 130 (e.g., a number of banks of DRAM cells, NAND flash cells, etc.).

The embodiment of FIG. 1 can include additional circuitry that is not illustrated so as not to obscure embodiments of the present disclosure. For example, the memory device 104 can include address circuitry to latch address signals provided over I/O connections through I/O circuitry. Address signals can be received and decoded by a row decoder and a column decoder to access the memory device 104 and/or the memory array 130. It will be appreciated by those skilled in the art that the number of address input connections can depend on the density and architecture of the memory device 104 and/or the memory array 130.

FIG. 2A is another functional block diagram in the form of a computing system 200 including a host 202 and a memory device 204 in accordance with a number of embodiments of the present disclosure. The memory device 204 can include acceleration circuitry 220, which can be analogous to the acceleration circuitry 120 illustrated in FIG. 1. Similarly, the host 202 can be analogous to the host 102 illustrated in FIG. 1, the conversion component 211 can be analogous to the conversion component 111 illustrated in FIG. 1, the memory device 204 can be analogous to the memory device 104 illustrated in FIG. 1, and the memory array 230 can be analogous to the memory array 130 illustrated in FIG. 1. Each of the components (e.g., the host 202, the conversion component 211, the acceleration circuitry 220, the logic circuitry 222, the memory resource 224, and/or the memory array 230, etc.) can be separately referred to herein as an "apparatus."

The host 202 can be communicatively coupled to the memory device 204 via one or more channels 203, 205. The channels 203, 205 can be interfaces, buses, communication paths, or other physical connections that allow for data and/or commands to be transferred between the host 202 and the memory device 204. The channels 203, 205 can be used to transfer data between the memory device 204 and a host 202 and can be in the form of a standardized interface.

When the memory device 204 is used for data storage in a computing system 200, the channels 203, 205 can be a serial advanced technology attachment (SATA), peripheral component interconnect express (PCIe), or a universal serial bus (USB), a double data rate (DDR) interface, among other connectors and interfaces. In general, however, channels 203, 205 can provide an interface for passing control, address, data, and other signals between the memory device 204 and a host 202 having compatible receptors for the channels 203, 205. In some embodiments, commands to cause initiation of an operation (e.g., an operation to perform arithmetic and/or logical operations on the bit string(s) in the posit format) to be performed by the acceleration circuitry 220 can be transferred from the host via the channels 203, 205.

It is noted that, in some embodiments, the acceleration circuitry 220 can perform the arithmetic and/or logical operations in response to an initiation command transferred from the host 202 via one or more of the channels 203, 205 in the absence of an intervening command from the host 202. That is, once the acceleration circuitry 220 has received the command to initiate performance of an operation from the host 202, the operations can be performed by the acceleration circuitry 220 in the absence of additional commands from the host 202. However, in some embodiments, the acceleration circuitry 220 can perform the operations in response to receipt of a bit string (e.g., a bit string in the posit format) in the absence of a command (e.g., an initiation command) from the host 202 specifying that the operation is to be performed. For example, the acceleration circuitry 220 can be configured to self-initiate performance of arithmetic and/or logical operations on the received bit string(s) in response to receiving the bit string(s).

As mentioned above, the host 202 can include a conversion component 211, which can, as shown in FIG. 2A, further include a processing device 213 and a conversion component memory resource 215. The processing device 213 can include one or more hardware processors, such as a central processing unit, a microprocessor, an advanced RISC machine (ARM) device, etc. In some embodiments, the processing device 213 can employ an instruction set architecture (ISA) such as an x86 ISA, a reduced instruction set computer (e.g., a RISC-V) ISA, etc. Embodiments are not limited to these enumerated examples, however, and other processing devices 213 and/or ISAs can be used.

The conversion component memory resource 215 can include volatile memory resources, non-volatile memory resources, or a combination of volatile and non-volatile memory resources. In some embodiments, the conversion component memory resource 215 can be a random-access memory (RAM) such as static random-access memory (SRAM). Embodiments are not so limited, however, and the conversion component memory resource 215 can be a cache, one or more registers, NVRAM, ReRAM, FeRAM, MRAM, PCM), "emerging" memory devices such as 3-D Crosspoint (3D XP) memory devices, etc., or combinations thereof.

In the embodiment illustrated in FIG. 2A, the host 202 can further include an application programming interface (API) 217. Although illustrated as a single API, the API 217 can, in some embodiments, include multiple APIs. For example, the API 217 can include one or more "low level" APIs and/or one or more "high level" APIs. "Low level" and "high level" APIs refer to the abstraction level (e.g., in reference to the abstraction layers of the open systems interconnect (OSI) model of computing functions) of the API. For example, "low level" APIs generally refer to APIs that operate at low OSI abstraction layers, such as the physical layer, data link layer, etc., while "high level" APIs operate at high OSI abstraction layers, such as the application layer, presentation layer, etc.

In some embodiments, the API 217 can be a high level API such as an application level API. In some embodiments, the API 217 can be configured to perform operations to convert bit strings from one format to another format, and vice versa. Converting a bit string from one format (e.g., a first format) to another format (e.g., a second format) can include converting a bit string in a floating-point format to a bit string in a posit format, and vice versa. In a non-limiting example, the API 217 can perform operations to convert bit strings from one format to another format, and vice versa, by controlling the conversion component 211, however, embodiments are not so limited and, in some embodiments, the API 217 can perform operations to convert bit strings from one format to another format, and vice versa, by accessing circuitry (e.g., processing devices available to the host 202) separate from those associated with the conversion component 211, and/or the API 217 can perform operations to convert bit strings from one format to another format, and vice versa, without accessing the conversion component 211 or the processing device 213 associated therewith.

In some embodiments, the conversion component memory resource 215 can be configured to receive data comprising a bit string having a first format that supports arithmetic operations to a first level of precision. The processing device 213 can be configured to receive the data from the memory resource and convert the bit string to a second format that supports arithmetic operations to a second level of precision that is different from the first level of precision. For example, the conversion component memory resource 215 can be configured to receive a bit string in a floating-point format (e.g., an IEEE 754 format) and the processing device 213 can be configured to convert the bit string to universal number (unum) format (e.g., a Type I unum, a Type II unum, a Type III unum, a posit, a valid, etc.).

As used herein, a "first level of precision" and a "second level of precision" generally refer to the accuracy of a bit string and/or a resultant bit string that represent a result of an operation performed using one or more bit strings. For example, floating-point format bit strings can be described herein as having a "first level of precision," while unum bit strings (e.g., posit format bit strings) can be referred to as having a "second level of precision," because, as described in more detail herein, unum bit strings can offer a higher level of precision under certain conditions than floating-point formatted numbers.

In some embodiments, the first format or the second format can include a mantissa, a base, and an exponent portion and the other of the first format or the second format can include a mantissa, a sign, a regime, and an exponent portion. For example, if the first format includes a mantissa, a base, and an exponent portion, the second format can include a mantissa, a sign, a regime, and an exponent portion.

The processing device 213 can be configured to cause the data having the bit string with the second format to be transferred to circuitry external to the host 202. For example, the processing device 213 can be configured to cause the data having the bit string with the second format to be transferred to the memory device 204 (e.g., to the acceleration circuitry 220, the memory array 230, etc.). As described above, the circuitry external to the host 202 can be configured to perform an arithmetic operation or a logical operation, or both, using the bit string having the second format. For example, the bit string having the second format can be transferred from the host 202 to the acceleration circuitry 220 of the memory device 204, which can include logic circuitry (e.g., the logic circuitry 122 illustrated in FIG. 1) that can be configured to perform an arithmetic operation or a logical operation, or both, using the bit string having the second format. Embodiments are not so limited, however, and in some embodiments, the processing device 213 can be configured to perform an arithmetic operation or a logical operation, or both, using the bit string having the second format.

In some embodiments, the conversion component memory resource 215 can receive a resultant bit string representing a result of an arithmetic operation or a logical operation, or both. The resultant bit string can be formatted in the second format. The processing device 213 can convert the resultant bit string to the first format. For example, if the resultant bit string is formatted in the posit format, the processing device 213 can convert the resultant bit string to a floating-point format.

As shown in FIG. 2A, the memory device 204 can include a register access component 206, a high speed interface (HSI) 208, a controller 210, one or more extended row address (XRA) component(s) 212, main memory input/output (I/O) circuitry 214, row address strobe (RAS)/column address strobe (CAS) chain control circuitry 216, a RAS/CAS chain component 218, acceleration circuitry 220, and a memory array 230. The acceleration circuitry 220 is, as shown in FIG. 2A, located in an area of the memory device 204 that is physically distinct from the memory array 230. That is, in some embodiments, the acceleration circuitry 220 is located in a periphery location of the memory array 230.

The register access component 206 can facilitate transferring and fetching of data from the host 202 to the memory device 204 and from the memory device 204 to the host 202. For example, the register access component 206 can store addresses (or facilitate lookup of addresses), such as memory addresses, that correspond to data that is to be transferred to the host 202 form the memory device 204 or transferred from the host 202 to the memory device 204. In some embodiments, the register access component 206 can facilitate transferring and fetching data that is to be operated upon by the acceleration circuitry 220 and/or the register access component 206 can facilitate transferring and fetching data that is has been operated upon by the acceleration circuitry 220 for transfer to the host 202.

The HSI 208 can provide an interface between the host 202 and the memory device 204 for commands and/or data traversing the channel 205. The HSI 208 can be a double data rate (DDR) interface such as a DDR3, DDR4, DDR5, etc. interface. Embodiments are not limited to a DDR interface, however, and the HSI 208 can be a quad data rate (QDR) interface, peripheral component interconnect (PCI) interface (e.g., a peripheral component interconnect express (PCIe)), or other suitable interface for transferring commands and/or data between the host 202 and the memory device 204 via the channel(s) 203, 205.

The controller 210 can be responsible for executing instructions from the host 202 and accessing the acceleration circuitry 220 and/or the memory array 230. The controller 210 can be a state machine, a sequencer, or some other type of controller. The controller 210 can receive commands from the host 202 (via the HSI 208, for example) and, based on the received commands, control operation of the acceleration circuitry 220 and/or the memory array 230. In some embodiments, the controller 210 can receive a command from the host 202 to cause performance of an arithmetic and/or logical operation on received bit strings using the acceleration circuitry 220. Responsive to receipt of such a command, the controller 210 can instruct the acceleration circuitry 220 to begin performance of the arithmetic and/or logical operation(s).

In some embodiments, the controller 210 can be a global processing controller and may provide power management functions to the memory device 204. Power management functions can include control over power consumed by the memory device 204 and/or the memory array 230. For example, the controller 210 can control power provided to various banks of the memory array 230 to control which banks of the memory array 230 are operational at different times during operation of the memory device 204. This can include shutting certain banks of the memory array 230 down while providing power to other banks of the memory array 230 to optimize power consumption of the memory device 230. In some embodiments, the controller 210 controlling power consumption of the memory device 204 can include controlling power to various cores of the memory device 204 and/or to the acceleration circuitry 220, the memory array 230, etc.

The XRA component(s) 212 are intended to provide additional functionalities (e.g., peripheral amplifiers) that sense (e.g., read, store, cache) data values of memory cells in the memory array 230 and that are distinct from the memory array 230. The XRA components 212 can include latches and/or registers. For example, additional latches can be included in the XRA component 212. The latches of the XRA component 212 can be located on a periphery of the memory array 230 (e.g., on a periphery of one or more banks of memory cells) of the memory device 204.

The main memory input/output (I/O) circuitry 214 can facilitate transfer of data and/or commands to and from the memory array 230. For example, the main memory I/O circuitry 214 can facilitate transfer of bit strings, data, and/or commands from the host 202 and/or the acceleration circuitry 220 to and from the memory array 230. In some embodiments, the main memory I/O circuitry 214 can include one or more direct memory access (DMA) components that can transfer the bit strings (e.g., posit bit strings stored as blocks of data) from the acceleration circuitry 220 to the memory array 230, and vice versa.

In some embodiments, the main memory I/O circuitry 214 can facilitate transfer of bit strings, data, and/or commands from the memory array 230 to the acceleration circuitry 220 so that the acceleration circuitry 220 can perform arithmetic and/or logical operations on the bit strings. Similarly, the main memory I/O circuitry 214 can facilitate transfer of bit strings that have had one or more operations performed on them by the acceleration circuitry 220 to the memory array 230. As described in more detail herein, the operations can include arithmetic operations performed on bit strings in a posit format, logical operations performed on bit strings in a posit format, bitwise operations performed on bit strings in a posit format, etc.

The row address strobe (RAS)/column address strobe (CAS) chain control circuitry 216 and the RAS/CAS chain component 218 can be used in conjunction with the memory array 230 to latch a row address and/or a column address to initiate a memory cycle. In some embodiments, the RAS/CAS chain control circuitry 216 and/or the RAS/CAS chain component 218 can resolve row and/or column addresses of the memory array 230 at which read and write operations associated with the memory array 230 are to be initiated or terminated. For example, upon completion of an operation using the acceleration circuitry 220, the RAS/CAS chain control circuitry 216 and/or the RAS/CAS chain component 218 can latch and/or resolve a specific location in the memory array 230 to which the bit strings that have been operated upon by the acceleration circuitry 220 are to be stored. Similarly, the RAS/CAS chain control circuitry 216 and/or the RAS/CAS chain component 218 can latch and/or resolve a specific location in the memory array 230 from which bit strings are to be transferred to the acceleration circuitry 220 prior to the acceleration circuitry 220 performing an operation on the bit string(s).

As described above in connection with FIG. 1, the memory array 230 can be a DRAM array, SRAM array, STT RAM array, PCRAM array, TRAM array, RRAM array, NAND flash array, and/or NOR flash array, for instance, although embodiments are not limited to these particular examples. The memory array 230 can function as main memory for the computing system 200 shown in FIG. 2. In some embodiments, the memory array 230 can be configured to store bit strings operated on by the acceleration circuitry 220 and/or store bit strings to be transferred to the acceleration circuitry 220.

The acceleration circuitry 220 can include logic circuitry (e.g., the logic circuitry 122 illustrated in FIG. 1) and/or memory resource(s) (e.g., the memory resource 124 illustrated in FIG. 1). As described above in connection with FIG. 1 and in more detail below in connection with FIG. 5, the acceleration circuitry 220 can be configured to receive one or more bit strings in the posit format and cause performance of operations such as arithmetic and/or logical operations using the one or more bit strings in the posit format.

For example, bit strings (e.g., data, a plurality of bits, etc.) can be received by the acceleration circuitry 220 from, for example, the host 202, the conversion component 211, and/or the memory array 230, and stored by the acceleration circuitry 220, for example in the memory resource (e.g., the memory resource 524 illustrated in FIG. 5, herein) of the acceleration circuitry 220. The acceleration circuitry (e.g., the logic circuitry of the acceleration circuitry 220) can perform arithmetic and/or logical operations (or cause arithmetic and/or logical operations to be performed on) the bit string(s), as described in more detail in connection with FIG. 5, herein.

As described in more detail in connection with FIGS. 3 and 4A-4B, posits can provide improved accuracy (e.g., precision) and may require less storage space (e.g., may contain a smaller number of bits) than corresponding bit strings represented in the floating-point format. Accordingly, by converting the floating-point bit strings to posit bit strings using conversion component 211 and performing arithmetic and/or logical operations using the acceleration circuitry 220, performance of the computing system 200 may be improved in comparison to approaches that utilize only floating-point bit strings, because operations may be performed more quickly on the posit bit strings (e.g., because the data in the posit format is smaller and therefore requires less time to perform operations on) and because less memory space is required in the memory device 204 to store the bit strings in the posit format, which can free up additional space in the memory device 204 to store other bit strings, data, and/or to perform other operations on data stored in the memory device 204.

As described above, once the acceleration circuitry 220 has received the posit bit strings from the host 202, the conversion circuitry 211, and/or the memory array 230, the acceleration circuitry 220 can perform (or cause performance of) arithmetic and/or logical operations on the received posit bit strings. For example, the acceleration circuitry 220 can be configured to perform (or cause performance of) arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. on the received posit bit strings. As will be appreciated, the foregoing list of operations is not intended to be exhaustive, nor is the foregoing list of operations intended to be limiting, and the acceleration circuitry 220 may be configured to perform (or cause performance of) other arithmetic and/or logical operations on posit bit strings.

In some embodiments, the acceleration circuitry 220 may perform the above-listed operations in conjunction with execution of one or more machine learning algorithms. For example, the acceleration circuitry 220 may perform operations related to one or more neural networks. Neural networks may allow for an algorithm to be trained over time to determine an output response based on input signals. For example, over time, a neural network may essentially learn to better maximize the chance of completing a particular goal. This may be advantageous in machine learning applications because the neural network may be trained over time with new data to achieve better maximization of the chance of completing the particular goal. A neural network may be trained over time to improve operation of particular tasks and/or particular goals. However, in some approaches, machine learning (e.g., neural network training) may be processing intensive (e.g., may consume large amounts of computer processing resources) and/or may be time intensive (e.g., may require lengthy calculations that consume multiple cycles to be performed). In contrast, by performing such operations using the acceleration circuitry 220, for example, by performing such operations on bit strings in the posit format, the amount of processing resources and/or the amount of time consumed in performing the operations may be reduced in comparison to approaches in which such operations are performed using bit strings in a floating-point format.

FIG. 2B is yet another functional block diagram in the form of a computing system including an apparatus including a host and a memory device in accordance with a number of embodiments of the present disclosure. The host 202 can include acceleration circuitry 220, which can be analogous to the acceleration circuitry 120 illustrated in FIG. 1. Similarly, the host 202 can be analogous to the host 102 illustrated in FIG. 1, the memory device 204 can be analogous to the memory device 104 illustrated in FIG. 1, and the memory array 230 can be analogous to the memory array 130 illustrated in FIG. 1, etc. Each of the components (e.g., the host 202, the conversion component 211, the accelera- tion circuitry 220, the logic circuitry 222, the memory resource 224, and/or the memory array 230, etc.) can be separately referred to herein as an "apparatus."

In the embodiment illustrated in FIG. 2B, the acceleration circuitry 220 is resident on the host 202. Although shown as part of the conversion component 211 in FIG. 2B, the acceleration circuitry 220 can be physically discrete from the conversion component 211, or a portion of the acceleration circuitry 220 can be provided as part of the conversion circuitry 211.

As described above, the conversion circuitry 211 can be configured to perform various operations on bit strings received by, and/or stored by, the conversion component 211. For example, the conversion component 211 can be configured to perform operations to convert bit strings from one format to another format, and vice versa. In some embodiments, converting a bit string from one format (e.g., a first format) to another format (e.g., a second format) can include converting a floating-point format bit string to a posit format bit string. For example, the conversion component 211 can convert bit strings that have three sets of bits (e.g., portions) associated therewith (e.g., a mantissa portion, a base portion, and an exponent portion) into bit strings that have four sets of bits associated therewith (e.g., a mantissa portion, a sign portion, a regime portion, and an exponent portion), and vice versa.

The conversion component 211 can be configured to transfer the converted bit strings to the acceleration circuitry 220. As described above, the bit strings transferred from the conversion component 111 to the memory device 104 can be bit strings that have been converted from one format (e.g., a floating-point format) to another format (e.g., a unum format, a posit format, etc.) by the conversion component 211. The acceleration circuitry 220 can then perform arithmetic and/or logical operations on the posit bit strings received from the conversion component 211.

After the arithmetic and/or logical operation(s) have been performed by the acceleration circuitry 220, the resultant bit string can be transferred to the memory device 204 (e.g., to the memory array 230 to be stored), or the resultant bit string can be transferred to the conversion component 211 and converted to a different format. For example, the resultant bit string can be transferred from the acceleration circuitry 220 to the conversion component 211 in the posit format, and the conversion component 211 can perform an operation on the resultant bit string to convert it from the posit format to a floating-point format. In some embodiments, the converted resultant bit string can be transferred to the memory device 204 and stored, for example, in the memory array 230.

Figure 2C:
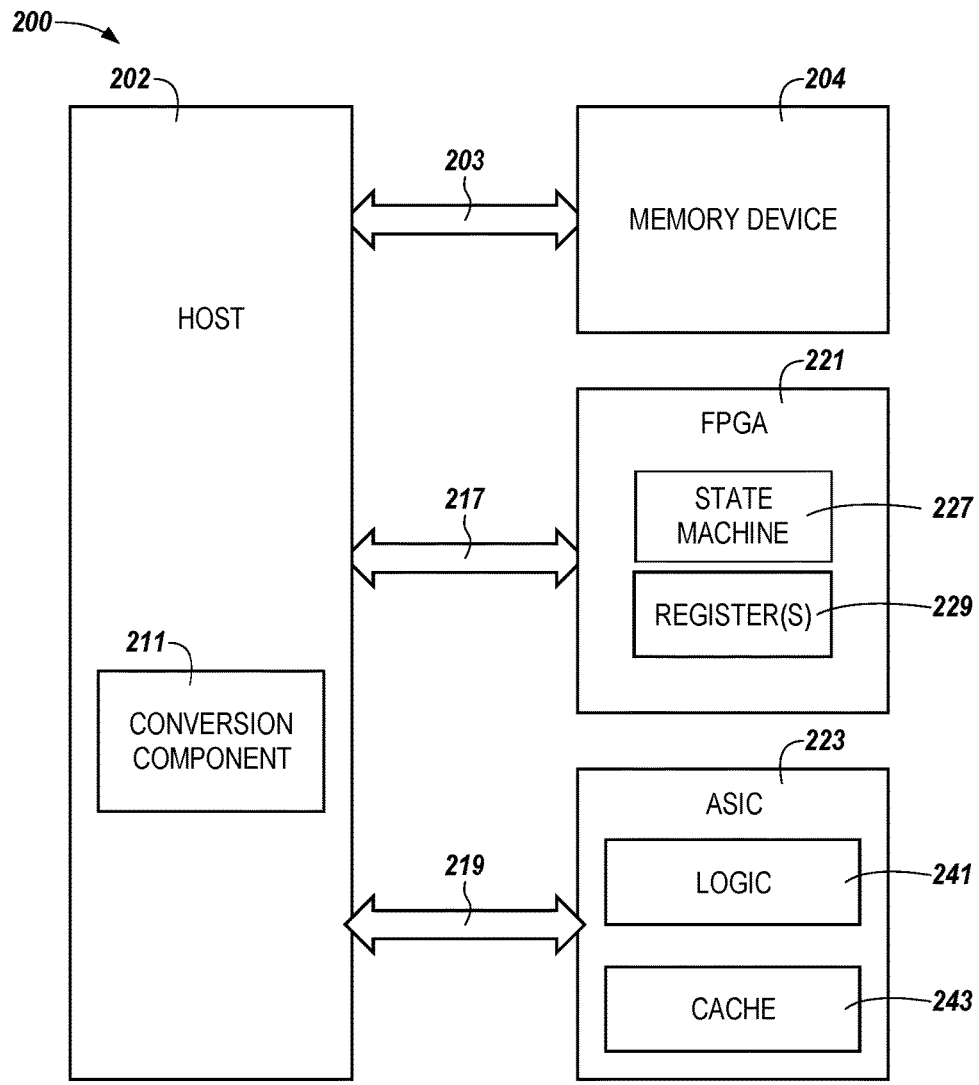
FIG. 2C is a functional block diagram in the form of a computing system including a host, a memory device, an application-specific integrated circuit, and a field programmable gate array in accordance with a number of embodiments of the present disclosure.

FIG. 2C is a functional block diagram in the form of a computing system 200 including a host 202, a memory device 204, an application-specific integrated circuit 223, and a field programmable gate array 221 in accordance with a number of embodiments of the present disclosure. Each of the components (e.g., the host 202, the conversion component 211, the memory device 204, the FPGA 221, the ASIC 223, etc.) can be separately referred to herein as an "apparatus."

As shown in FIG. 2C, the host 202 can be coupled to the memory device 204 via channel(s) 203, which can be analogous to the channel(s) 103 illustrated in FIG. 1. The field programmable gate array (FPGA) 221 can be coupled to the host 202 via channel(s) 217 and the application-specific integrated circuit (ASIC) 223 can be coupled to the host 202 via channel(s) 219. In some embodiments, the channel(s) 217 and/or the channel(s) 219 can include a peripheral serial interconnect express (PCIe) interface, however, embodiments are not so limited, and the channel(s) 217 and/or the channel(s) 219 can include other types of interfaces, buses, communication channels, etc. to facilitate transfer of data between the host 202 and the FPGA 221 and/or the ASIC 223.

As described above, the conversion component 211 can perform an operation on bit strings stored in a first format to convert the bit string to a second format, and vice versa. Subsequent to performing the operation to convert the bit strings to the second format, the conversion component 211 can cause the bit strings (e.g., posit bit strings) to be transferred to the FPGA 221 and/or to the ASIC 223. Upon receipt of the posit bit strings, the FPGA 221 and/or the ASIC 223 can perform arithmetic and/or logical operations on the received posit bit strings.

As described above, non-limiting examples of arithmetic and/or logical operations that can be performed by the FPGA 221 and/or the ASIC 223 include arithmetic operations such as addition, subtraction, multiplication, division, fused multiply addition, multiply-accumulate, dot product units, greater than or less than, absolute value (e.g., FABS( )), fast Fourier transforms, inverse fast Fourier transforms, sigmoid function, convolution, square root, exponent, and/or logarithm operations, and/or logical operations such as AND, OR, XOR, NOT, etc., as well as trigonometric operations such as sine, cosine, tangent, etc. using the posit bit strings.

The FPGA 221 can include a state machine 227 and/or register(s) 229. The state machine 227 can include one or more processing devices that are configured to perform operations on an input and produce an output. For example, the FPGA 221 can be configured to receive posit bit strings from the host 202 (e.g., form the conversion component 211) and perform arithmetic and/or logical operations on the posit bit strings to produce resultant posit bit strings that represents a result of the operation performed on the received posit bit strings.

The register(s) 229 of the FPGA 221 can be configured to buffer and/or store the posit bit strings received form the host 202 prior to the state machine 227 performing an operation on the received posit bit strings. In addition, the register(s) 229 of the FPGA 221 can be configured to buffer and/or store a resultant posit bit string that represents a result of the operation performed on the received posit bit strings prior to transferring the result to circuitry external to the ASIC 233, such as the host 202 or the memory device 204, etc.

The ASIC 223 can include logic 241 and/or a cache 243. The logic 241 can include circuitry configured to perform operations on an input and produce an output. In some embodiments, the ASIC 223 is configured to receive posit bit strings from the host 202 (e.g., form the conversion component 211) and perform arithmetic and/or logical operations on the posit bit strings to produce resultant posit bit strings that represents a result of the operation performed on the received posit bit strings.

The cache 243 of the ASIC 223 can be configured to buffer and/or store the posit bit strings received form the host 202 prior to the logic 241 performing an operation on the received posit bit strings. In addition, the cache 243 of the ASIC 223 can be configured to buffer and/or store a resultant posit bit string that represents a result of the operation performed on the received posit bit strings prior to transferring the result to circuitry external to the ASIC 233, such as the host 202 or the memory device 204, etc.

Although the FPGA 227 is shown as including a state machine 227 and register(s) 229, in some embodiments, the FPGA 221 can include logic, such as the logic 241, and/or a cache, such as the cache 243 in addition to, or in lieu of, the state machine 227 and/or the register(s) 229. Similarly, the ASIC 223 can, in some embodiments, include a state machine, such as the state machine 227, and/or register(s), such as the register(s) 229 in addition to, or in lieu of, the logic 241 and/or the cache 243.

Figure 3:
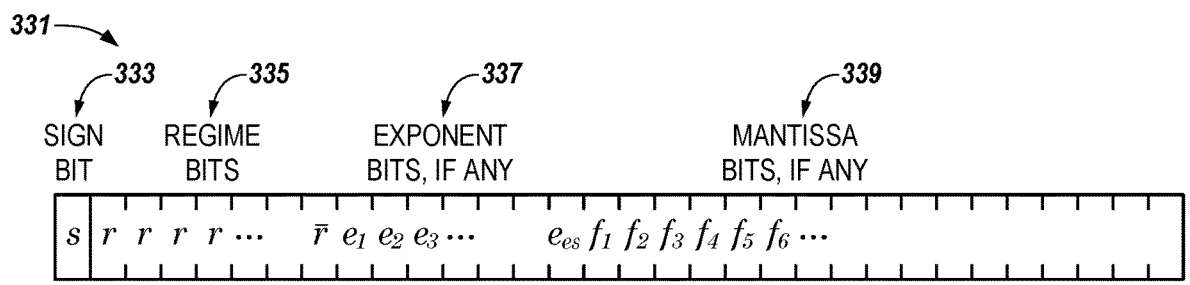
FIG. 3 is an example of an n-bit post with es exponent bits.

FIG. 3 is an example of an n-bit universal number, or "unum" with es exponent bits. In the example of FIG. 3, the n-bit unum is a posit bit string 331. As shown in FIG. 3, the n-bit posit 331 can include a set of sign bit(s) (e.g., a sign bit 333), a set of regime bits (e.g., the regime bits 335), a set of exponent bits (e.g., the exponent bits 337), and a set of mantissa bits (e.g., the mantissa bits 339). The mantissa bits 339 can be referred to in the alternative as a "fraction portion" or as "fraction bits," and can represent a portion of a bit string (e.g., a number) that follows a decimal point.

The sign bit 333 can be zero (0) for positive numbers and one (1) for negative numbers. The regime bits 335 are described in connection with Table 1, below, which shows (binary) bit strings and their related numerical meaning, k. In Table 1, the numerical meaning, k, is determined by the run length of the bit string. The letter x in the binary portion of Table 1 indicates that the bit value is irrelevant for determination of the regime, because the (binary) bit string is terminated in response to successive bit flips or when the end of the bit string is reached. For example, in the (binary) bit string 0010, the bit string terminates in response to a zero flipping to a one and then back to a zero. Accordingly, the last zero is irrelevant with respect to the regime and all that is considered for the regime are the leading identical bits and the first opposite bit that terminates the bit string (if the bit string includes such bits).

TABLE 1

| Binary | 0000 | 0001 | 001X | 01XX | 10XX | 110X | 1110 | 1111 |
|---|---|---|---|---|---|---|---|---|
| Numerical (k) | −4 | −3 | −2 | −1 | 0 | 1 | 2 | 3 |

In FIG. 3, the regime bits 335 r correspond to identical bits in the bit string, while the regime bits 335 r̄ correspond to an opposite bit that terminates the bit string. For example, for the numerical k value −2 shown in Table 1, the regime bits r correspond to the first two leading zeros, while the regime bit(s) r̄ correspond to the one. As noted above, the final bit corresponding to the numerical k, which is represented by the X in Table 1 is irrelevant to the regime.

If m corresponds to the number of identical bits in the bit string, if the bits are zero, k=−m. If the bits are one, then k=m−1. This is illustrated in Table 1 where, for example, the (binary) bit string 10XX has a single one and k=m−1=1−1=0. Similarly, the (binary) bit string 0001 includes three zeros so k=−m=−3. The regime can indicate a scale factor of $useed^k$, where $useed=2^{2^{es}}$. Several example values for useed are shown below in Table 2.

TABLE 2

| es | 0 | 1 | 2 | 3 | 4 |
|---|---|---|---|---|---|
| useed | 2 | $2^2 = 4$ | $4^2 = 16$ | $16^2 = 256$ | $256^2 = 65536$ |

The exponent bits 337 correspond to an exponent e, as an unsigned number. In contrast to floating-point numbers, the exponent bits 337 described herein may not have a bias associated therewith. As a result, the exponent bits 337 described herein may represent a scaling by a factor of $2^e$.

As shown in FIG. 3, there can be up to es exponent bits ($e_1$, $e_2$, $e_3$, ..., $e_{es}$), depending on how many bits remain to right of the regime bits 335 of the n-bit posit 331. In some embodiments, this can allow for tapered accuracy of the n-bit posit 331 in which numbers which are nearer in magnitude to one have a higher accuracy than numbers which are very large or very small. However, as very large or very small numbers may be utilized less frequent in certain kinds of operations, the tapered accuracy behavior of the n-bit posit 331 shown in FIG. 3 may be desirable in a wide range of situations.

The mantissa bits 339 (or fraction bits) represent any additional bits that may be part of the n-bit posit 331 that lie to the right of the exponent bits 337. Similar to floating-point bit strings, the mantissa bits 339 represent a fraction $f$, which can be analogous to the fraction $1.f$, where $f$ includes one or more bits to the right of the decimal point following the one. In contrast to floating-point bit strings, however, in the n-bit posit 331 shown in FIG. 3, the "hidden bit" (e.g., the one) may always be one (e.g., unity), whereas floating-point bit strings may include a subnormal number with a "hidden bit" of zero (e.g., 0f).

Figure 4A:
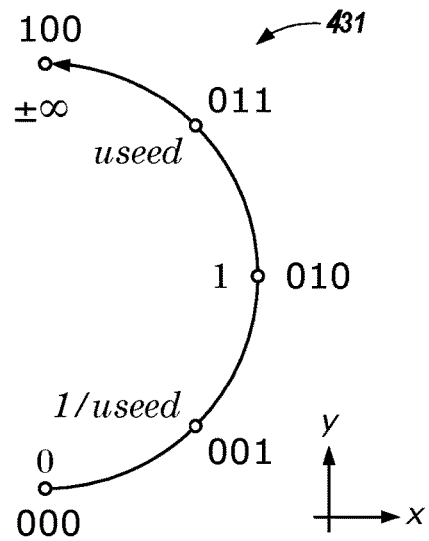
FIG. 4A is an example of positive values for a 3-bit posit.

FIG. 4A is an example of positive values for a 3-bit posit 431. In FIG. 4A, only the right half of projective real numbers, however, it will be appreciated that negative projective real numbers that correspond to their positive counterparts shown in FIG. 4A can exist on a curve representing a transformation about they-axis of the curves shown in FIG. 4A.

In the example of FIG. 4A, es=2, so useed=$2^{2^{es}}$=16. The precision of a posit 431 can be increased by appending bits the bit string, as shown in FIG. 4B. For example, appending a bit with a value of one (1) to bit strings of the posit 431-1 increases the accuracy of the posit 431 as shown by the posit 431-2 in FIG. 4B. Similarly, appending a bit with a value of one to bit strings of the posit 431-2 in FIG. 4B increases the accuracy of the posit 431-2 as shown by the posit 431-3 shown in FIG. 4B. An example of interpolation rules that may be used to append bits to the bits strings of the posits 431-1 shown in FIG. 4A to obtain the posits 431-2, 431-3 illustrated in FIG. 4B follow.

Figure 4B:
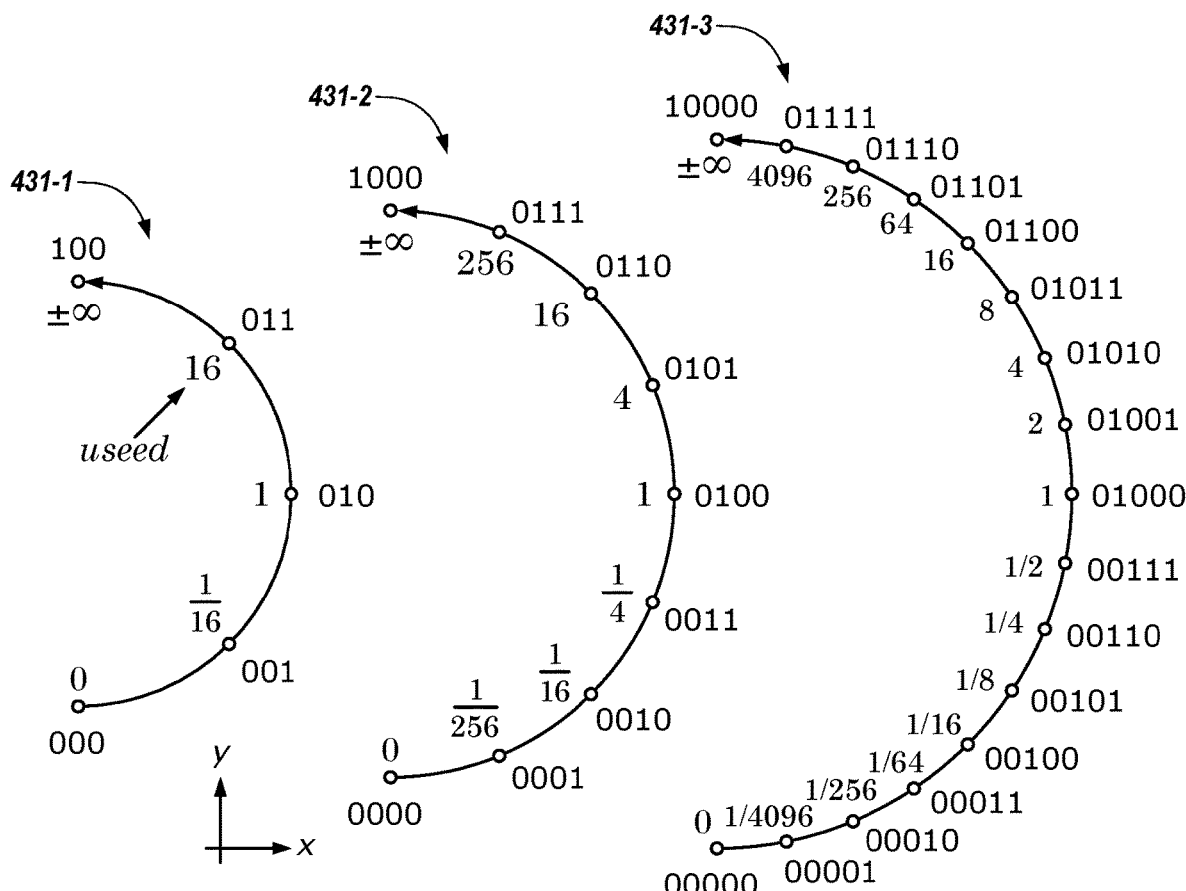
FIG. 4B is an example of posit construction using two exponent bits.

If maxpos is the largest positive value of a bit string of the posits 431-1, 431-2, 431-3 shown in FIG. 4B, and minpos is the smallest value of a bit string of the posits 431-1, 431-2, 431-3, maxpos may be equivalent to useed and minpos may be equivalent to $$\frac{1}{useed}.$$

Between maxpos and ±∞, a new bit value may be maxpos*useed, and between zero and minpos, a new bit value may be $$\frac{minpos}{useed}.$$

These new bit values can correspond to a new regime bit 335. Between existing values $x=2^m$ and $y=2^n$, where m and n differ by more than one, the new bit value may be given by the geometric mean:

$$\sqrt{x \times y} = 2^{\frac{(m+n)}{2}},$$

which corresponds to a new exponent bit 337. If the new bit value is midway between the existing x and y values next to it, the new bit value can represent the arithmetic mean $$\frac{x+y}{2},$$

which corresponds to a new mantissa bit 339.

FIG. 4B is an example of posit construction using two exponent bits. In FIG. 4B, only the right half of projective real numbers, however, it will be appreciated that negative projective real numbers that correspond to their positive counterparts shown in FIG. 4B can exist on a curve representing a transformation about they-axis of the curves shown in FIG. 4B. The posits 431-1, 431-2, 431-3 shown in FIG. 4B each include only two exception values: Zero (0) when all the bits of the bit string are zero and ±∞ when the bit string is a one (1) followed by all zeros. It is noted that the numerical values of the posits 431-1, 431-2, 431-3 shown in FIG. 4 are exactly useed$^k$. That is, the numerical values of the posits 431-1, 431-2, 431-3 shown in FIG. 4 are exactly useed to the power of the k value represented by the regime (e.g., the regime bits 335 described above in connection with FIG. 3). In FIG. 4B, the posit 431-1 has es=2, so useed=$2^{2^{es}}$=16, the posit 431-2 has es=3, so useed=$2^{2^{es}}$=256, and the posit 431-3 has es=4, so useed=$2^{2^{es}}$=4096.

As an illustrative example of adding bits to the 3-bit posit 431-1 to create the 4-bit posit 431-2 of FIG. 4B, the useed=256, so the bit string corresponding to the useed of 256 has an additional regime bit appended thereto and the former useed, 16, has a terminating regime bit ($\bar{r}$) appended thereto. As described above, between existing values, the corresponding bit strings have an additional exponent bit appended thereto. For example, the numerical values ¹⁄₁₆, ¼, 1, and 4 will have an exponent bit appended thereto. That is, the final one corresponding to the numerical value 4 is an exponent bit, the final zero corresponding to the numerical value 1 is an exponent bit, etc. This pattern can be further seen in the posit 431-3, which is a 5-bit posit generated according to the rules above from the 4-bit posit 431-2. If another bit was added to the posit 431-3 in FIG. 4B to generate a 6-bit posit, mantissa bits 339 would be appended to the numerical values between ¹⁄₁₆ and 16.

A non-limiting example of decoding a posit (e.g., a posit 431) to obtain its numerical equivalent follows. In some embodiments, the bit string corresponding to a posit p is an unsigned integer ranging from $-2^{n-1}$ to $2^{n-1}$, k is an integer corresponding to the regime bits 335 and e is an unsigned integer corresponding to the exponent bits 337. If the set of mantissa bits 339 is represented as $\{f_1 f_2 \ldots f_{fs}\}$ and $f$ is a value represented by $1.f_1 f_2 \ldots f_{fs}$ (e.g., by a one followed by a decimal point followed by the mantissa bits 339), the p can be given by Equation 1, below.

$$x = \begin{cases} 0, & p = 0 \\ \pm\infty, & p = -2^{n-1} \\ \text{sign}(p) \times useed^k \times 2^e \times f, & \text{all other } p \end{cases} \quad \text{Equation 1}$$

A further illustrative example of decoding a posit bit string is provided below in connection with the posit bit string 0000110111011101 shown in Table 3, below follows.

TABLE 3

| SIGN | REGIME | EXPONENT | MANTISSA |
|---|---|---|---|
| 0 | 0001 | 101 | 11011101 |

In Table 3, the posit bit string 0000110111011101 is broken up into its constituent sets of bits (e.g., the sign bit 333, the regime bits 335, the exponent bits 337, and the mantissa bits 339). Since es=3 in the posit bit string shown in Table 3 (e.g., because there are three exponent bits), useed=256. Because the sign bit 333 is zero, the value of the numerical expression corresponding to the posit bit string shown in Table 3 is positive. The regime bits 335 have a run of three consecutive zeros corresponding to a value of −3 (as described above in connection with Table 1). As a result, the scale factor contributed by the regime bits 335 is $256^{-3}$ (e.g., useed$^k$). The exponent bits 337 represent five (5) as an unsigned integer and therefore contribute an additional scale factor of $2^e = 2^5 = 32$. Lastly, the mantissa bits 339, which are given in Table 3 as 11011101, represent two-hundred and twenty-one (221) as an unsigned integer, so the mantissa bits 339, given above as $f$ are $$f + \frac{221}{256}.$$

Using these values and Equation 1, the numerical value corresponding to the posit bit string given in Table 3 is $$+256^{-3} \times 2^5 \times \left(1 + \frac{221}{256}\right) = \frac{437}{134217728} \approx 3.55393 \times 10^{-6}.$$

Figure 5:
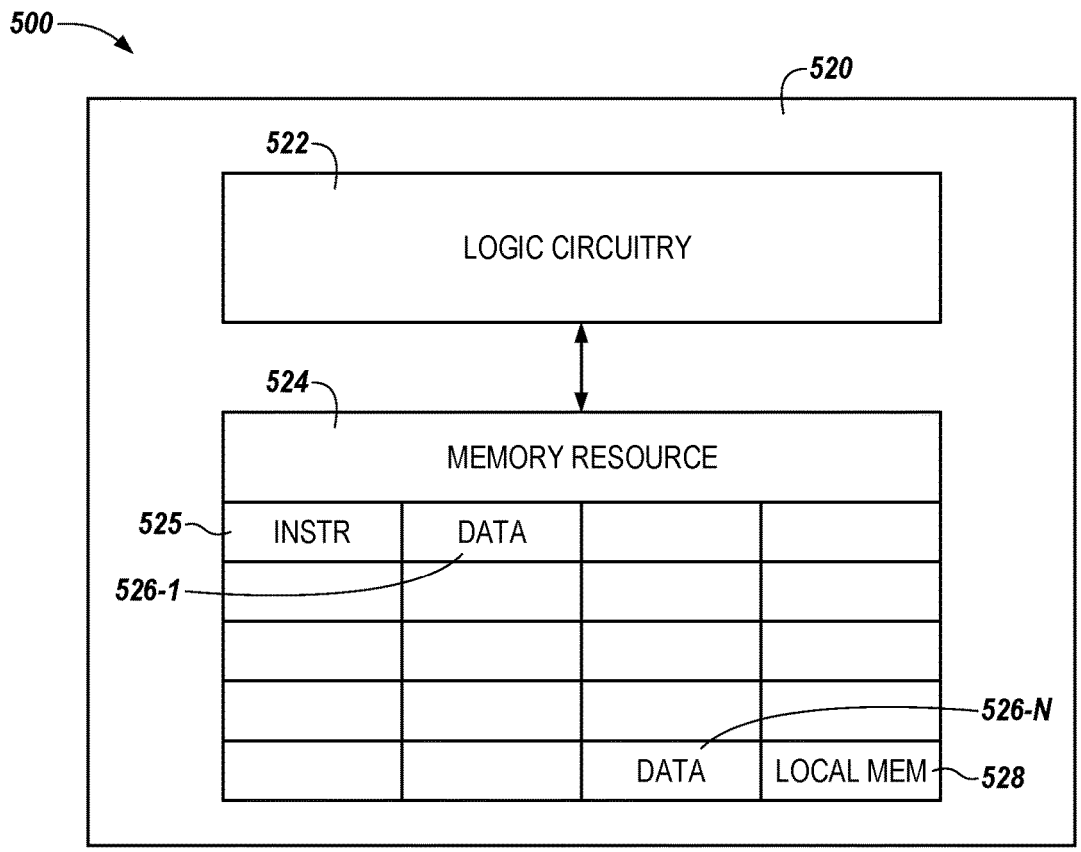
FIG. 5 is a functional block diagram in the form of acceleration circuitry in accordance with a number of embodiments of the present disclosure.

FIG. 5 is a functional block diagram in the form of an apparatus 500 including acceleration circuitry 520 in accordance with a number of embodiments of the present disclosure. The acceleration circuitry 520 can include logic circuitry 522 and a memory resource 524, which can be analogous to the logic circuitry 122 and the memory resource 124 illustrated in FIG. 1, herein. The logic circuitry 522 and/or the memory resource 524 can separately be considered an "apparatus."

The acceleration circuitry 520 can be configured to receive a bit string in the posit format from a host (e.g., the host 102/202 illustrated in FIGS. 1, 2A, and 2B, herein) or a conversion component (e.g., the conversion component 111/211 illustrated in FIGS. 1, 2A, and 2B, herein). In some embodiments, the posit bit string can be stored in the memory resource 524. Once the bit string has been received by the acceleration circuitry 520, the acceleration circuitry can perform arithmetic and/or logical operations on the posit bit string in the absence of intervening commands from the host and/or the controller. For example, the acceleration circuitry 520 can include sufficient processing resources and/or instructions to perform arithmetic and/or logical operations on the bit strings stored in the memory resource 524 without receiving additional commands from circuitry external to the acceleration circuitry 520.

The logic circuitry 522 can be an arithmetic logic unit (ALU), a state machine, sequencer, controller, an instruction set architecture (ISA), or other type of control circuitry. As described above, an ALU can include circuitry to perform operations (e.g., arithmetic operations, logical operations, bitwise operations, etc.) such as the operations described above, on integer binary numbers, such as bit strings in the posit format. An instruction set architecture (ISA) can include a reduced instruction set computing (RISC) device. In embodiments in which the logic circuitry 522 includes a RISC device, the RISC device can include a processing resource that can employ an instruction set architecture (ISA) such as a RISC-V ISA, however, embodiments are not limited to RISC-V ISAs and other processing devices and/or ISAs can be used.

In some embodiments, the logic circuitry 522 can be configured to execute instructions (e.g., instructions stored in the INSTR 525 portion of the memory resource 524) to perform the operations above. For example, the logic circuitry 524 is provisioned with sufficient processing resources to cause performance of arithmetic and/or logical operations on the data (e.g., on bit strings) received by the acceleration circuitry 520.

Once the arithmetic and/or logical operation(s) are performed by the logic circuitry 522, the resultant bit strings can be stored in the memory resource 524 and/or a memory array (e.g., the memory array 230 illustrated in FIG. 2, herein). The stored resultant bit strings can be addressed such that they are accessible for performance of the operations. For example, the bit strings can be stored in the memory resource 524 and/or the memory array at particular physical addresses (which may have corresponding logical addresses corresponding thereto) such that the bit strings can be accessed in performing the operations.

The memory resource 524 can, in some embodiments, be a memory resource such as random-access memory (e.g., RAM, SRAM, etc.). Embodiments are not so limited, however, and the memory resource 524 can include various registers, caches, buffers, and/or memory arrays (e.g., 1T1C, 2T2C, 3T, etc. DRAM arrays). The memory resource 524 can be configured to receive a bit string (e.g., a bit string in the posit format) from, for example, a host such as the host 102/202 illustrated in FIGS. 1, 2A, and 2B, a conversion component such as the conversion component 111/211 illustrated in FIGS. 1, 2A, and 2B, and/or a memory array such as the memory array 230 illustrated in FIGS. 2A and 2B, herein. In some embodiments, the memory resource 538 can have a size of approximately 256 kilobytes (KB), however, embodiments are not limited to this particular size, and the memory resource 524 can have a size greater than, or less than, 256 KB.

The memory resource 524 can be partitioned into one or more addressable memory regions. As shown in FIG. 5, the memory resource 524 can be partitioned into addressable memory regions so that various types of data can be stored therein. For example, one or more memory regions can store instructions ("INSTR") 525 used by the memory resource 524, one or more memory regions can store data 526-1, . . . , 526-N (e.g., data such as a bit string retrieved from the host and/or the memory array), and/or one or more memory regions can serve as a local memory ("LOCAL MEM.") 528 portion of the memory resource 538. Although 20 distinct memory regions are shown in FIG. 5, it will be appreciated that the memory resource 524 can be partitioned into any number of distinct memory regions.

As discussed above, the bit string(s) can be retrieved from the host and/or memory array in response to messages and/or commands generated by the host, a controller (e.g., the controller 210 illustrated in FIG. 2, herein), or the logic circuitry 522. In some embodiments, the commands and/or messages can be processed by the logic circuitry 522. Once the bit string(s) are received by the acceleration circuitry 520 and stored in the memory resource 524, they can be processed by the logic circuitry 522. Processing the bit string(s) by the logic circuitry 522 can include performing arithmetic operations and/or logical operations on the received bit string(s).

In a non-limiting neural network training application, the acceleration circuitry 520 can receive a floating-point bit string that has been converted by the conversion component into an 8-bit posit with es=0. In contrast to some approaches that utilize a half-precision 16-bit floating-point bit string for neural network training, an 8-bit posit bit string with es=0 can provide comparable neural network training results two to four times faster than the half-precision 16-bit floating-point bit string.

A common function used in training neural networks is a sigmoid function $f(x)$ (e.g., a function that asymptotically approaches zero as $x \to -\infty$ and asymptotically approaches 1 as $x \to \infty$). An example of a sigmoid function that may be used in neural network training applications is $$\frac{1}{1+e^{-x}},$$

which can require upwards of one-hundred clock cycles to compute using half-precision 16-bit floating-point bit strings. However, using an 8-bit posit with es=0, the same function can be evaluated by the acceleration circuitry 520 by flipping the first bit of the posit representing x and shifting two bits to the right—operations that may take at least an order of magnitude fewer clock signals in comparison to evaluation of the same function using a half-precision 16-bit floating-point bit string.

In this example, by receiving a bit string that has been converted by the conversion component into an 8-bit posit bit string with es=0 and then subsequently operating the acceleration circuitry 520 to perform the operation to evaluate the example sigmoid function on the 8-bit posit bit string, processing time, resource consumption, and/or storage space can be reduced in comparison to approaches that do not include acceleration circuitry 520 configured to perform such operations. This reduction in processing time, resource consumption, and/or storage space can improve the function of a computing system in which the acceleration circuitry 520 is operating by reducing the number of clock signals used in performing such operations, which may reduce an amount of power consumed by the computing device and/or an amount of time to perform such operations, as well as by freeing up processing and/or memory resources for other tasks and functions.

Figure 6:
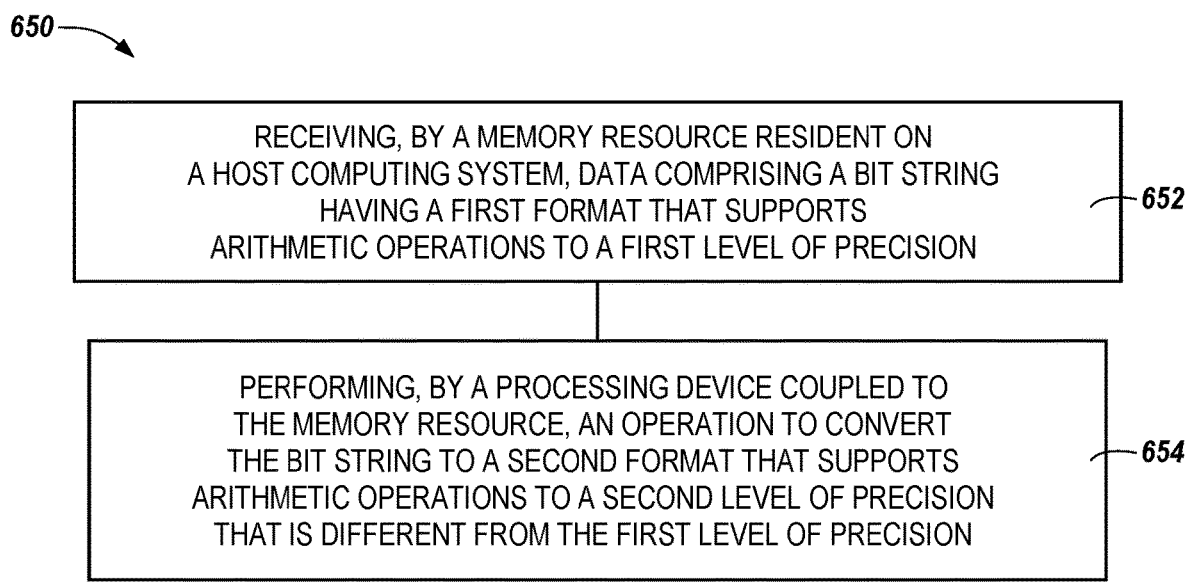
FIG. 6 is a flow diagram representing an example method for arithmetic logic circuitry in accordance with a number of embodiments of the present disclosure.

FIG. 6 is a flow diagram representing an example method 650 for arithmetic logic circuitry in accordance with a number of embodiments of the present disclosure. At block 652, the method 650 can include receiving, by a memory resource resident on a host computing system, data comprising a bit string having a first format that supports arithmetic operations to a first level of precision. The memory resource can be analogous to the conversion component memory resource 215 illustrated in FIG. 2A, and the host computing system can be analogous to the host 102/202 illustrated in FIGS. 1, 2A, and 2B, herein.

At block 654, the method 650 can include performing, by a processing device coupled to the memory resource, an operation to convert the bit string to a second format that supports arithmetic operations to a second level of precision that is different from the first level of precision. The processing device can be analogous to the processing device 213 illustrated in FIG. 2A, herein. In some embodiments, the first format can include a mantissa, a base, and an exponent, and the second format can include a mantissa, a regime, a sign, and an exponent. As described above, the first format can be a floating-point format and the second format can be a posit format. In some embodiments, the method 650 can include performing the operation to convert the bit string with the first format to a bit string with a second format in response to receiving the bit string with the first format in the absence of an intervening host command, as described above.

The method 650 can further include causing, by the processing device, the bit string having the second format to be transferred to circuitry external to the host computing device. In some embodiments, the circuitry external to the host can include acceleration circuitry such as the acceleration circuitry 120/220/520 illustrated in FIGS. 1, 2A, 2B, and 5, herein.

In some embodiments, the method 650 can include performing an arithmetic operation and/or a logical operation using the bit string having the second format as an operand for the at arithmetic operation and/or the logical operation. For example, the method 650 can include performing, by the circuitry external to the host, an operation using the bit string having the second format. The operation can, in some embodiments, be a bit-wise operation, vector operation, or other arithmetic operation and/or a logical operation, as described in more detail above. In some embodiments, the operation can be an operation used as part of training a neural network. For example, the operation can be a convolution operation, a sigmoid function operation, etc.

The method 650 can include performing, by the processing device coupled to the memory resource, a subsequent operation to convert a bit string subsequently received by the memory resource and having the second format to a second bit string having the first format. For example, the method 650 can include receiving, a resultant bit string from the circuitry external to the host in a posit format and performing a second conversion operation using the processing device to convert the result of the operation to a floating-point format.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment.

Thus, the following claims are hereby incorporated into the Detailed Description, with each claim standing on its own as a separate embodiment.

What is claimed is:

1. An apparatus, comprising:
a conversion component memory resource resident on a host computing system and configured to receive, from a memory array resident on a memory device coupled to the host computing system, data comprising a bit string having a first format that supports arithmetic operations to a first level of precision; and
a processing device resident on the host computing system and coupled to the conversion component memory resource, wherein the processing device is configured to:
receive the data from the conversion component memory resource and convert the bit string to yield a converted bit string having a second format that supports arithmetic operations to a second level of precision that is different from the first level of precision; and
transfer the converted bit string to acceleration circuitry comprising logic circuitry and a non-volatile memory resource, the acceleration circuitry resident on the memory device coupled to the host computing system, wherein
the acceleration circuitry is configured to perform, as part of performance of a machine learning operation, an arithmetic operation or a logical operation, or both, using the converted bit string in the absence of an intervening command from the host computing device.

2. The apparatus of claim 1, wherein the first format comprises a floating-point format and the second format comprises a universal number format or wherein the first format comprises an IEEE 754 format and the second format comprises a Type III universal number format or a posit format.

3. The apparatus of claim 1, wherein one of the first format or the second format includes a mantissa, a base, and an exponent portion, and wherein the other of the first format or the second format includes a mantissa, a sign, a regime, and an exponent portion.

4. The apparatus of claim 1, wherein the conversion component memory resource is configured to receive a resultant bit string representing a result of the arithmetic operation or the logical operation, or both, the resultant bit string having the second format, and wherein the processing device is configured to convert the resultant bit string to the first format.

5. The apparatus of claim 1, wherein the processing device is further configured to perform at least a portion of the arithmetic operation or the logical operation, or both, using the bit string having the second format prior to transferring the converted bit string to the acceleration circuitry.

6. A method, comprising:
receiving, by a conversion component memory resource resident on a host computing system, data stored in a memory array of a memory device coupled to the host computing system and comprising a bit string having a first format that supports arithmetic operations to a first level of precision;
performing, by a processing device coupled to the conversion component memory resource, an operation to convert the bit string to yield a converted bit string having a second format that supports arithmetic operations to a second level of precision that is different from the first level of precision;
transferring the converted bit string to acceleration circuitry comprising logic circuitry and a non-volatile memory resource, the acceleration circuitry resident on the memory device coupled to the host computing system;
performing, using the acceleration circuitry and as part of performance of a machine learning operation, an arithmetic operation or a logical operation, or both, using the converted bit string in the absence of an intervening command from the host computing device; and
writing a result of the arithmetic operation or the logical operation, or both to at least one of the memory array or the host computing system.

7. The method of claim 6, further comprising performing, by the processing device, a subsequent operation to convert a bit string subsequently received by the conversion component memory resource and having the second format to a second bit string having the first format.

8. The method of claim 6, further comprising performing the arithmetic operation or the logical operation, or both, using the bit string having the second format as an operand for the arithmetic operation or the logical operation, or both.

9. The method of claim 6, further comprising performing the operation to convert the bit string from the first format to the second format in response to receiving the bit string having the first format in the absence of an intervening host command.

10. The method of claim 6, wherein converting, by the processing device, the bit string having the first format to the bit string having the second format comprises converting a floating-point format bit string to a universal number format bit string.

11. A system, comprising:
a host computing system comprising a conversion component memory resource and a processing device; and
a non-volatile memory device comprising acceleration circuitry and a memory array, wherein the non-volatile memory device is coupled to the host computing system, and wherein the acceleration circuitry comprises logic circuitry and a memory resource, and wherein:
the conversion component memory resource is configured to receive a bit string having a first format that supports arithmetic operations to a first level of precision from the memory array;
the processing device is configured to:
convert the bit string to yield a converted bit string having a second format that supports arithmetic operations to a second level of precision;
cause the converted bit string to be transferred to the memory resource of the acceleration circuitry; and
the acceleration circuitry is configured to:
store the converted bit string in the memory resource of the acceleration circuitry;
cause, within the acceleration circuitry, performance of an arithmetic operation or a logical operation, or both, using the converted bit string responsive to receipt of the converted bit string in the absence of an intervening command generated by the host computing system.

12. The system of claim 11, wherein one of the first format or the second format includes a mantissa, a base, and an exponent portion, and wherein the other of the first format or the second format includes a mantissa, a sign, a regime, and an exponent portion.

13. The system of claim 11, wherein:
the logic circuitry is further configured to transfer a resultant bit string representing a result of an arithmetic operation or a logical operation, or both, to the conversion component memory resource, the resultant bit string having the second format; and
the processing device is further configured to convert the resultant bit string to the first format.

14. The system of claim 13, wherein the resultant bit string comprises a Type III universal number format or a posit format, and wherein the first format comprises a floating-point format.

15. The system of claim 13, wherein the processing device is configured to convert the resultant bit string to the first format responsive to receipt of the resultant bit string by the conversion component memory resource in the absence of an intervening command.

16. The system of claim 11, wherein the host further comprises an application programming interface configured to control an operation performed by the processing device to convert the bit string to the second format.

17. The system of claim 11, wherein the acceleration circuitry is further configured to write a result of the arithmetic operation or the logical operation, or both to the memory array or the host, or both.

18. The system of claim 11, wherein the conversion component memory resource is configured to receive a resultant bit string representing a result of the arithmetic operation or the logical operation, or both, the resultant bit string having the second format, and wherein the processing device is configured to convert the resultant bit string to the first format.

* * * * *